United States Patent [19]
Ito et al.

[11] Patent Number: 4,738,910
[45] Date of Patent: Apr. 19, 1988

[54] METHOD OF APPLYING A RESIST

[75] Inventors: Tetsuo Ito, Mito; Masaya Tanuma, Yokohama; Yoshiyuki Nakagomi, Yamanashi; Kazuya Kadota; Kazunari Kobayashi, both of Tokyo, all of Japan

[73] Assignee: Hitachi, Ltd., Tokyo, Japan

[21] Appl. No.: 872,506

[22] Filed: Jun. 10, 1986

[30] Foreign Application Priority Data

Jun. 12, 1985 [JP] Japan ................ 60-126133

[51] Int. Cl.$^4$ .................................... G03C 5/00
[52] U.S. Cl. ........................... 430/30; 430/270; 430/311; 430/322; 430/327; 430/935; 427/9; 427/240
[58] Field of Search ............. 430/30, 311, 327, 935, 430/269, 270, 322; 427/240, 9

[56] References Cited
U.S. PATENT DOCUMENTS 4,500,615  2/1985  Iwai ................................ 430/30

FOREIGN PATENT DOCUMENTS 59-155930  9/1984  Japan .
59-155925  9/1984  Japan .
59-155927  9/1984  Japan .
59-155921  9/1984  Japan .

*Primary Examiner*—Richard R. Bueker
*Assistant Examiner*—José G. Dees
*Attorney, Agent, or Firm*—Fay, Sharpe, Beall, Fagan, Minnich & McKee

[57] ABSTRACT

A photoresist process which comprises a process for spin-coating a substrate with a resist, a process for transferring a mask pattern onto the coated resist film followed by exposure, and a developing process for forming a pattern on the substrate after the pattern has been exposed. When the developed pattern of the resist pulsates with the increase or decrease of parameters in the process for applying resist, the value of the parameter is set to a value that corresponds to an extreme value of the pulsation.

6 Claims, 3 Drawing Sheets

DEVELOPED PATTERN

F I G. 5
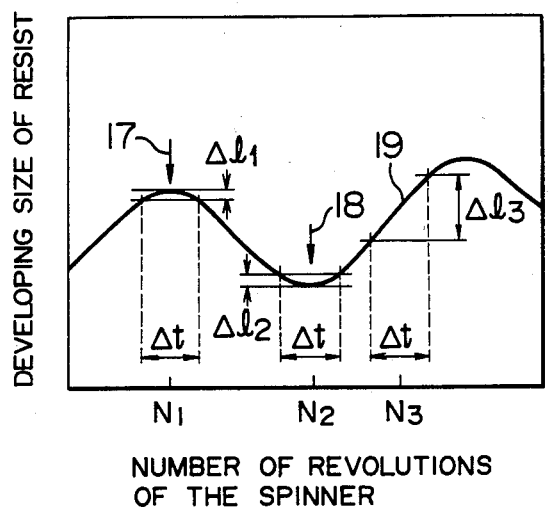

METHOD OF APPLYING A RESIST

BACKGROUND OF THE INVENTION

The present invention relates to a method of applying a resist, and particularly to a method of applying a resist that is adapted for a process for producing highly integrated circuit elements where little variation is allowed in the size of the developed pattern.

A method of applying a resist has been disclosed in Japanese Patent Laid-Open No. 155925/1984. According to this method, the photosensitive reaction is effected prior to applying the resist. However, nothing has been referred to in regard to optimizing the film thickness of the resist. Further, Japanese Patent Laid-Open Nos. 155930/1984, 155927/1984 and 155921/1984 disclose methods of applying a resist in relation to forming fine patterns. However, none of them teach to optimize the film thickness of the resist.

SUMMARY OF THE INVENTION

The object of the present invention is to provide a method of applying a resist, which is capable of increasing the production yields of highly integrated circuit elements while decreasing the variance in the developing size of elements formed on the silicon wafers.

If a resist film is applied too thickly, little light enters into the interior of the resist film and the size changes after developing. This is called the bulk effect. With a reduction projection exposure apparatus which uses light of a single wavelength, however, the reflectance varies on the surface of the resist due to interference of light in the resist film. Therefore, the size of the developed pattern pulsates sinusoidally as the film thickness increases. In such a case, variance in the size of the developed pattern can be minimized by setting the thickness of the resist film to a value that corresponds to an extreme value (a portion where the gradient of a curve that represents the dependency of the developed size upon the thickness of resist film becomes zero) of pulsation.

BRIEF DESCRIPTION OF THE DRAWINGS

FIG. 5 is a diagram which shows the dependency of the developing size of the resist upon the number of revolutions of the spinner.

DESCRIPTION OF THE PREFERRED EMBODIMENTS

Figure 1:
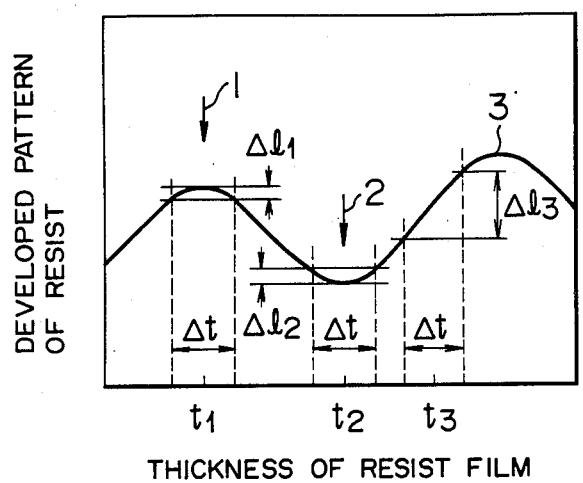
FIG. 1 is a diagram which shows the dependency of the developing size of the resist upon the thickness of the resist film according to an embodiment of the present invention.
Figure 2:
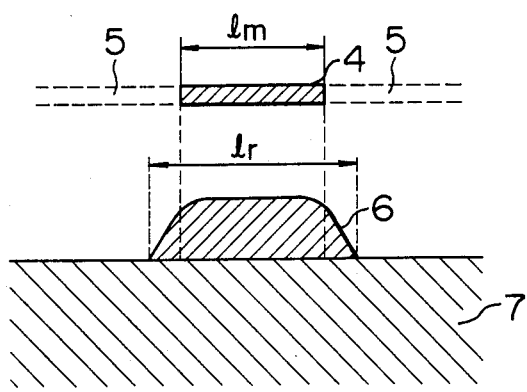
FIG. 2 is a section view of the resist.
Figure 3:
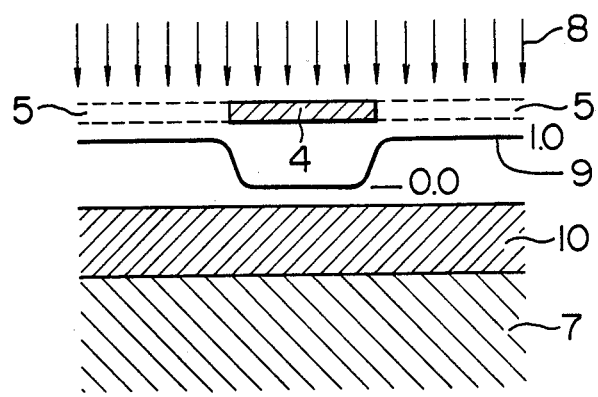
FIG. 3 is a diagram which illustrates the projection of a mask pattern onto the resist.

An embodiment of the invention will be described below in conjunction with FIG. 1. It was found that as the thickness of the resist film is increased by about 10 nm each time, the resist size (width lr of resist line 6 of FIG. 2, which should desirably be equal to the line width lm of a mask pattern which consists of a line portion 4 and a space portion 5) after developing pulsates as represented by a curve 3 in FIG. 1. A process for forming the resist line 6 on a silicon substrate 7 will be described below in conjunction with FIG. 3. First, the silicon substrate 7 is spin-coated with a resist 10 to a thickness of about 1 $\mu$m. A projected image of mask pattern consisting of space portion 5 and line portion 4 is then irradiated with a source of ultraviolet rays 8. In this case, the intensity of light on the resist 10 is weak at a position which corresponds to the line portion and is strong at a position which corresponds to the space portion, as represented by a curve 9 having intensity values varying from 1 to 0. If developing is performed after irradiation with ultraviolet rays, the resist melts at a portion which corresponds to the strongly irradiated space portion 5. The resist at a portion corresponding to the weakly irradiated line portion 4 does not melt but remains to form the resist line 6 shown in FIG. 2.

This is a positive type of resist. In the case of a negative-type resist, on the other hand, a resist line is formed at a portion that corresponds to the space portion.

When a silicon wafer is spin-coated with the resist to a thickness of about 1 $\mu$m, in general, the film thickness does not become uniform but varies by about 200 angstroms. Therefore, variance develops in the width of the resist line that is formed after developing. As is evident from FIG. 1, the range of variance of the line width greatly changes depending upon the set point (central value in the variance of resist film thickness) of the thickness of resist film. For instance, if the thickness of the resist film is denoted by $t_3$, the film thickness varies over a range $\Delta t$; consequently, the developed pattern varies over a range $\Delta l_3$. However, if the thickness of the resist film is set to $t_2$ which corresponds to a minimum value of the curve 3, the developed pattern varies over a range $\Delta l_2$ despite the thickness of the resist film varying over the same range $\Delta t$, which is a reduction into about one-fifth from the range $\Delta l_3$. Even if the thickness of the resist film is set to $t_1$ which corresponds to a maximum value 1 of the curve 3, the developing size varies over a range $\Delta l_1$, which is a reduction into about one-fifth from the range $\Delta l_3$. Here, the range $\Delta l_3$ generally has a value of 0.3 $\mu$m. This value becomes intolerable as the resist size approaches 1 $\mu$m.

Here, it is presumed that the allowable value of variance in the developing size is $\pm \Delta l$ with respect to the design size ld in the photoresist process for producing semiconductor elements. If now the setpoint of thickness of the resist film is erroneously set to $t_3$ in FIG. 1, the size of the developed pattern varies greatly, and the number of semiconductor elements relative to the developed pattern is distributed as represented by a curve 11 in FIG. 4. Many elements (those denoted by 12, 13) that lie outside the allowable pattern ld$\pm \Delta l$ become defective. However, when the setpoint of the thickness of the resist film is set to $t_1$ or $t_2$ in FIG. 1, variance in the developed pattern decreases as represented by a curve 14, and the proportion of defective elements decreases to less than 10% as distributed in the portions denoted by 15 and 16.

In the foregoing were mentioned the pulsation of the resist developed pattern relative to the thickness of the resist film and the accompanying variance. When the thickness of the resist film cannot be directly measured, however, the developed pattern of the resist is measured relative to the number of revolutions of the spinner (spin-coating apparatus) which applies the resist to a thickness of about 1 $\mu$m. The thickness of resist film pulsates as represented by a curve 19 in FIG. 5. As the number of revolutions of the spinner is changed as denoted by $N_1$, $N_2$ and $N_3$, the developed pattern varies little as denoted by $\Delta l_1$ and $\Delta l_2$ when the number of revolutions $N_1$, $N_2$ correspond to extreme values 17, 18 even though the thickness of the resist film varies over the same range $\Delta t$ as that of FIG. 1. When the number of revolutions $N_3$ does not correspond to the extreme value, however, the developed pattern varies over an increased range $\Delta l_3$. Thus, by suitably setting the number of revolutions of the spinner, variance in the developed pattern can be reduced.

Figure 4:
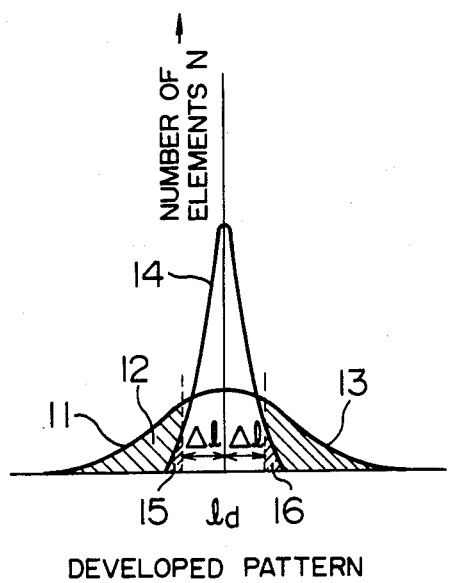
FIG. 4 is a diagram of distribution to explain the variance in the developing size.

FIG. 4 is a diagram which illustrates the variance in the developing size.

What is claimed is:

1. A photoresist applying method, comprising the steps of: spin-coating a substrate with a resist, transferring a mask pattern onto the coated resist film followed by exposing the resist film, and developing the resist film to form a pattern on the substrate, wherein the improvement comprises, determining a plurality of extreme values of a curve in which the size of the developed pattern of said resist pulsates sinusoidally in relation to the increase or decrease of a resist thickness determining parameter, and controlling said spin-coating by setting said parameter to a value that corresponds with one of said extreme values of said pulsation to minimize variations in the size of the developed pattern as caused by variations in said parameter.

2. A method of applying a resist according to claim 1, wherein the parameter is the number spin-coating of revolutions in said spin-coating step at the time of coating said resist.

3. A method of forming a photoresist on a substrate comprising the steps of:
    forming a developed pattern in each of a plurality of photoresists having a range of thicknesses;
    (b) measuring the width of each developed pattern of photoresists in relation to the thickness of resist on which said pattern is formed and determining extreme values of a curve that represents the relationship between the measured width of the developed patterns and the corresponding thickness of the photoresist, and thereafter
    (c) forming a photoresist on a substrate and controlling the forming so that the thickness of said photoresist is set to a value that substantially corresponds to one of said extreme values.

4. A method for forming a photoresist according to claim 3, wherein said forming is by spinner coating; and said step of controlling controls the number of spinner revolutions applied in said forming of the photoresist.

5. A photoresist applying method wherein a resist is coated on a substrate in a coating step and irradiated through a mask and thereafter developed so that portions of the resist may be removed and line resist portions retained in accordance with the pattern of the mask, wherein the characteristics of the materials, including the resist and irradiation are such that the width of the developed line resist portions pulsate sinusoidally in width parallel to the surface of the substrate as the resist thickness increases, including the steps of:
    determining the sinusoidal pulsation dependency of the width of the developed line resist portions upon the resist thickness characteristics of the materials; and
    controlling said coating of the resist so that the central value in the variation of coated thickness of the resist corresponds to an extreme value of the sinusoidal dependency where the gradient of the sinusoidal pulsation becomes zero, so as to minimize the variation in line resist portion width of the developed pattern due to variations in resist coating thickness.

6. A photoresist applying method wherein a resist is coated on a substrate in a coating step and irradiated through a mask and thereafter developed so that portions of the resist may be removed and line resist portions retained in accordance with the pattern of the mask, wherein the characteristics of the materials, including the resist and irradiation are such that the width of the developed line resist portions pulsate sinusoidally in width parallel to the surface of the substrate as the resist thickness increases, including the steps of:
    determining the sinusoidal pulsation dependency of the width of the developed line resist portions upon the resist thickness characteristics of the materials;
    controlling said coating of the resist so that the central value in the variation of coated thickness of the resist corresponds to an extreme value of the sinusoidal dependency where the gradient of the sinusoidal pulsation becomes zero, so as to minimize the variation in line resist portion width of the developed pattern due to variations in resist coating thickness;
    said coating employs spinner coating of the resist on the substrate; and
    said step of determining measures developed line resist portion widths corresponding to different measured numbers of spinner revolutions used in coating and determining the thickness of the resist; and
    said step of controlling limits the resist thickness by setting the number of spinner revolutions during said step of coating.

* * * * *